(12) United States Patent
Takahashi

(10) Patent No.: US 6,407,604 B1
(45) Date of Patent: Jun. 18, 2002

(54) REGISTER AND LATCH CIRCUITS

(75) Inventor: Hiroyuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/544,786

(22) Filed: Apr. 7, 2000

(30) Foreign Application Priority Data

Apr. 8, 1999 (JP) .......................................... 99-101479

(51) Int. Cl.[7] .............................................. H03K 3/289
(52) U.S. Cl. ...................................... 327/203; 327/211
(58) Field of Search ................................ 327/202, 203, 327/208, 210, 211, 212, 214

(56) References Cited

U.S. PATENT DOCUMENTS

| 5,497,114 A | * | 3/1996 | Shimozono et al. ......... 327/202 |
| 5,764,089 A | * | 6/1998 | Partovi et al. ............... 327/208 |
| 5,767,718 A | * | 6/1998 | Shih ........................... 327/203 |
| 5,905,393 A | * | 5/1999 | Rinderknecht et al. ..... 327/202 |
| 6,026,011 A | * | 2/2000 | Zhang ........................ 327/210 |

* cited by examiner

Primary Examiner—Toan Tran
(74) Attorney, Agent, or Firm—Darryl G. Walker

(57) ABSTRACT

Register and latch circuits are disclosed that can have faster operating speeds. According to one embodiment, a register circuit (100) may include a master latch circuit (102) and a slave latch circuit (104). The slave latch circuit (104) may include an n-channel transistor M13 between an input of the slave latch circuit (104) and the gate of a p-channel driver transistor M11. A p-channel transistor M14 can be provided between the input of the slave latch circuit (104) and the gate of an n-channel driver transistor M12. The driver transistors M11 and M12 can be driven by way of the source-drain paths of transistors M13 and M14, respectively.

12 Claims, 4 Drawing Sheets

REGISTER AND LATCH CIRCUITS

TECHNICAL FIELD

The present invention relates generally to semiconductor integrated circuits, and more particularly to register and latch circuits.

BACKGROUND OF THE INVENTION

The operating speeds of semiconductor devices continue to rise. Many integrated circuits include input circuits for latching input data. For example, many semiconductor devices are "synchronous" devices that latch input data in synchronism with a system clock. In addition, many integrated circuits can include output circuits that latch output data in response to a system clock. Still further, some integrated circuits have intermediate pipelined sections that may latch and/or shift data in response to a system clock. As device speeds increase, it can be important to reduce the time required for all aspects of device operation, including the time required to latch an input signal, and/or an output value and/or latch values in intermediate pipelined stages.

The operation of the disclosed embodiments may best be understood by first referring to a conventional register circuit.

FIG. 7 shows a conventional register circuit. The conventional register circuit is designated by the general reference character 700 and may include a master latch 702 and a slave latch 704. A master latch circuit 702 can have an input (IN) that receives an input value, and can latch data in response to a clock signal CLK. A slave latch 704 can have an output (OUT) that provides a latched value, and can also latch data in response to the clock signal CLK.

A master latch circuit 702 can store data when the CLK signal has a low level. In addition, with the CLK signal level low, the output of the master latch circuit 702 is prevented from being input into the slave latch circuit 704.

In the above-described arrangement, when the CLK signal transitions high, the input IN is disconnected from the internal circuits of the master latch circuit 702. At the same time, the output of master latch circuit 702 is input to the slave latch circuit 704, and provided as an output from the slave latch (OUT).

In synchronous devices, the clock signal CLK transitions between levels in a periodic fashion. Thus, in the example described above, each low-to-high transition can result in an output value at the output (OUT).

Next, the particular composition of a latch circuit will be described in more detail. FIG. 7 shows the details of slave latch circuit 704. A slave latch circuit 704 may include an input connected to the output of master latch circuit 702. The input of the slave latch circuit 704 can be further connected to the source-drain paths of a p-channel metal-oxide-semiconductor (PMOS) transistor M71 arranged in parallel with an n-channel MOS (NMOS) transistor M72. The gate of NMOS transistor M72 receives the clock signal CLK, while the gate of PMOS transistor M71 receives an inverted clock signal /CLK by way of an inverter INV71.

The slave latch circuit 704 further includes an inverter INV72 for driving the output of the slave latch 704 (and hence the register 700) in this case. The inverter INV72 can have an input connected to the source-drain paths of transistors M71/M72, and an output connected to output OUT. An inverter INV73 has an input connected to the output OUT, and an output connected to the source-drain paths of a PMOS transistor M73 arranged in parallel with an NMOS transistor M74. The gate of NMOS transistor M74 receives the inverted clock signal /CLK by way of inverter INV71, while the gate of PMOS transistor M73 can receive the clock signal CLK directly.

In the slave latch circuit 704 illustrated, when the clock signal CLK is high, transistors M71 and M72 are turned on while transistors M73 and M74 are turned off. Thus, the output from master latch 702 can be driven on output OUT by inverter INV72. In contrast, when the clock signal CLK is low, transistors M71 and M72 are turned off while transistors M73 and M74 are turned on. The data at the output OUT can be fed back through inverter INV73 to the input of inverter INV72, thus forming a flip-flop. In this way, the data value can continue to be held (latched) in the slave latch circuit 704.

In a conventional integrated circuit, a register circuit may have adjacent circuits that can present large loads. More particularly, an input register circuit may have an output connected to an internal driver circuit that drives various internal lines of the integrated circuit. An output register circuit may have an output connected to an output driver circuit that outputs data from the integrated circuit. Such large loads can add to signal propagation times.

Further, the load that must be driven by the clock signal can also be high. More particularly, while the clock signal CLK of FIG. 7 is shown driving two latch circuits (702 and 704), such a clock signal CLK may have to drive many such circuits.

One way to improve the speed in a conventional register circuit has been to attempt to reduce the input capacitance for the clock signal CLK. Gate capacitance can be reduced by decreasing the gate size of transistors M72 and M73 and the gates of transistors within inverter INV71. Such an approach can have limits, however. Reducing the size of transistors M72 and M73 can increase the "on" impedance of their respective transfer gates, increasing signal propagation time. Further, decreasing the size of transistors within inverter INV71 can reduce the driving strength of the inverter, which can further reduce the speed at which the transfer gates can turn on and off.

In addition to operating speed, another feature of an integrated circuit that may be considered valuable is that of current consumption. Lower current consumption can be desirable as power supplies may have limited current supply capabilities. Further, lower current consumption can translate directly into lower power consumption. Reductions in power consumption are particularly desirable in portable electronic devices that operate on batteries.

Yet another important feature of an integrated circuit is the amount of area that is required for such a circuit. The more area that an integrated circuit requires, the more expensive the device may be to manufacture.

It would be desirable to arrive at some way of improving the speed of a latching and/or register circuit. Such a faster circuit could contribute to a faster overall integrated circuit.

It would also be desirable if such a circuit did not significantly increase power and/or current consumption over conventional approaches.

It would be further desirable if such a circuit did not require a considerable amount of area over conventional approaches.

SUMMARY OF THE INVENTION

A register circuit according to the present invention may include a master latch circuit and a slave latch circuit arranged in series with one another. A slave latch circuit may include a first driver transistor that can drive an output node to a first potential and a second driver transistor that can drive the output node to a second potential. A first controllable impedance path can connect the control terminal of the first driver transistor to the output of the master latch circuit. A second controllable impedance path can connect the control terminal of the second driver to the output of the master latch circuit. The first and second controllable impedance paths can be enabled according to a clock signal.

The above arrangement, the controllable impedance paths can transfer an input signal to the respective driver transistor control terminals, and not a flip-flop type circuit, and thus may allow for faster operating speeds.

According to one aspect of the embodiments, the controllable impedance paths may include transistors, more particularly, insulated gate field effect transistors. Further, the transistor of the first controllable impedance path can have a conductivity that is different from the first driver transistor. Similarly, the transistor of the second controllable impedance path can have a conductivity that is different from the second driver transistor. In one arrangement, the first driver transistor can be a p-type transistor and the first controllable impedance path can include an n-type transistor that receives a clock signal at its control terminal. The second driver transistor can be an n-type transistor and the second controllable impedance path can include a p-type transistor that receives an inverted clock signal at its control terminal.

According to another aspect of the embodiments, the slave latch circuit may include a latched state where the data from the master latch circuit is latched within the slave latch circuit. The slave latch circuit may further include a first disable device connected to the control terminal of the first driver transistor and a second disable device connected to the control terminal of the second driver transistor. The first and second disable devices can turn the first and second driver transistors off in the latched state.

According to another aspect of the embodiments, the slave latch circuit may include a flip-flop circuit that can store data. The flip-flop circuit can include transistors having a smaller size than the first and/or second driver transistor. The transistors of the flip-flop circuit may also be smaller than transistors of the first and second controllable impedance paths.

According to another aspect of the embodiments, the slave latch circuit may include a flip-flop circuit that having a passgate between the output of the flip-flop circuit and the output of the slave latch circuit. The passgate circuit may include p-type and n-type transistors having source-drain paths arranged in parallel. The gate of the p-type passgate transistor can receive a clock signal while the gate of the n-type passgate transistor can receive an inverted clock signal.

According to another aspect of the embodiments, the slave latch circuit may include a disable path connected to the control terminal of the first driver transistor. When the second driver transistor is turned on, the disable path can provide a disable voltage to the second driver transistor. The disable path may be parallel to the first controllable impedance path.

According to another aspect of the embodiments, a disable path may include a transistor of a first conductivity type. In one arrangement, the control gate of the disable path transistor can receive an inverted clock signal. In another arrangement, the control gate of the disable path transistor can receive an inverted master latch circuit output signal. Such an arrangement can result in a reduced load for a clock signal.

According to another aspect of the embodiments, the slave latch circuit may include a disable path connected to the control terminal of the second driver transistor. When the second driver transistor is turned on, the disable path can provide a disable voltage to the first driver transistor. The disable path may be parallel to the second controllable impedance path.

According to one aspect of the above latch embodiments, a latch circuit may further include a first disable device connected to the control terminal of the first driver transistor, and a second disable device connected to the control terminal of the second driver transistor. When activated, the first disable device can disable the first driver transistor. Similarly, when enabled, the second disable device can disable the second driver transistor. An input value of one type can activate the first disable device and deactivate the second disable device. An input value of a second type can activate the second disable device and deactivate the first disable device.

According to another aspect of the embodiments, a capacitor can be provided at the input of the slave latch circuit. Such an arrangement can suppress transient rises in potential in the first and second controllable impedance paths when current flows through such paths.

A latch circuit according to the present invention may include a first driver transistor that can drive an output node to a first potential and a second driver transistor that can drive the output node to a second potential. A first controllable impedance path can connect the control terminal of the first driver to an inverted clock signal. A second controllable impedance path can connect the control terminal of the second driver to a clock signal.

The first controllable impedance path can include a first transfer gate that includes a first gate n-type transistor arranged in parallel with a first gate p-type transistor. The control terminal of the first gate n-type transistor can receive an input signal. The control terminal of the first gate p-type transistor can receive an inverted input signal. The second controllable impedance path can include a second transfer gate that includes a second gate n-type transistor arranged in parallel with a second gate p-type transistor. The control terminal of the second gate n-type transistor can receive an inverted input signal. The control terminal of the second gate p-type transistor can receive an input signal.

According to one aspect of the above latch embodiment, a latch circuit may further include a first disable device connected to the control terminal of the first driver transistor, and a second disable device connected to the control terminal of the second driver transistor. When activated, the first disable device can disable the first driver transistor. Similarly, when enabled, the second disable device can disable the second driver transistor. An input value of one type can activate the first disable device and deactivate the second disable device. An input value of a second type can activate the second disable device and deactivate the first disable device.

According to another aspect of the latch embodiments, the first driver transistor and first disable device can include p-type transistors that receive an input signal at their control terminals. The second driver transistor and second disable device can include n-type transistors that receive an inverted input signal at their gates.

According to another aspect of the latch embodiments, the latch circuit may include a flip-flop circuit that can store data. The flip-flop can include transistors having a smaller size than the first and/or second driver transistor. Further, the flip-flop can include transistors having a smaller size than the first and/or second disable device.

DETAILED DESCRIPTION OF THE EMBODIMENTS

Figure 1:
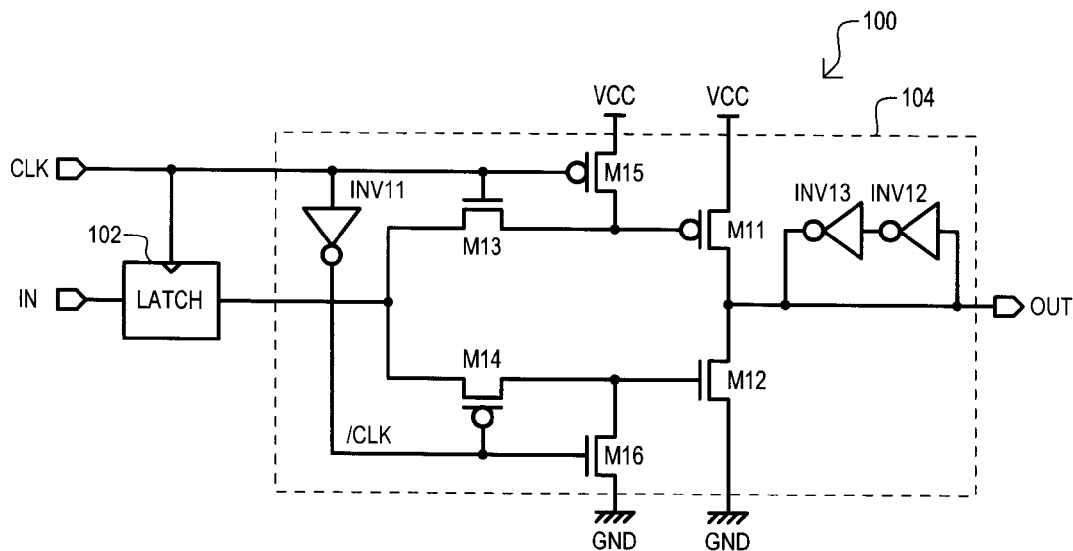
FIG. 1 is a circuit diagram of a register circuit according to a first embodiment.

Various embodiments according to the present invention will now be described with reference to a number of figures. A first embodiment is set forth in FIG. 1. The first embodiment is designated by the general reference character 100, and is shown to include a master latch 102 and a slave latch 104.

A slave latch 104 can include an output driving section that can include a transistor of a first type and a transistor of a second type. More particularly, the output driving section can include a p-type driver transistor M11 having a source-drain path arranged in series with an n-type driver transistor M12. P-type driver transistor M11 can have a source connected to a high power supply VCC. N-type driver transistor M12 can have a source connected to a low power supply (such as ground GND). The drain-drain connection of driver transistors M11 and M12 can be connected to the output of the slave latch 104, which can also be the register circuit 100 OUT.

The potential at the gate of p-type driver transistor M11 can be determined by the operation of transistors that receive the output of the master latch circuit 102 and the clock signal CLK. More particularly, an n-type transistor M13 can have a source-drain path connected between the gate of the p-type driver transistor M11 and an input of the slave latch circuit 104. In addition, a p-type transistor M15 can have a source-drain path connected between a high power supply voltage VCC and the gate of the p-type driver transistor M11. The gates of transistors M13 and M15 can both receive a clock signal CLK.

The potential at the gate of n-type driver transistor M12 can be determined by the operation of transistors that receive the output of the master latch 102 and an inverted clock signal /CLK. More particularly, a p-type transistor M14 can have a source-drain path connected between the gate of n-type driver transistor M12 and an input of the slave latch 104. In addition, an n-type transistor M16 can have a source-drain path connected between a low power supply voltage GND and the gate of the n-type driver transistor M12. The gates of transistors M14 and M16 can both receive an inverted clock signal /CLK by way of an inverter INV11.

The register circuit 100 also includes a data holding circuit connected to the output of the register circuit 100 (OUT). In one particular arrangement, the data holding circuit can include two inverters INV12 and INV13 arranged in series with one another to form a flip-flop. The input of inverter INV12 and output of inverter INV13 can be connected to the output of the register circuit 100 OUT.

Having described the general arrangement of a first embodiment 100, the operation of the first embodiment 100 will now be described.

When the clock signal CLK is low, a data value received at the input IN can pass through the master latch circuit 102 and be provided at the input of the slave latch circuit 104. In particular arrangements, the master latch circuit 102 can invert a received data value at its output.

Within the slave latch circuit 104, with the clock signal CLK low, n-type transistor M13 can be turned off, isolating the input of the slave latch circuit 104 from the gate of p-type driver transistor M11. P-type transistor M15 can be turned on, placing the gate of p-type driver transistor M11 at the high power supply voltage VCC. In this way, p-type driver transistor M11 is turned off, isolating the register output (OUT) from the high power supply voltage VCC. In addition, the low clock signal CLK can be inverted by inverter INV11 to generate a high inverted clock signal /CLK. With a high inverted clock signal /CLK, p-type transistor M14 can be turned off, isolating the input of the slave latch circuit 104 from the gate of n-type driver transistor M12. N-type transistor M16 can be turned on, placing the gate of n-type driver transistor M12 at the low power supply voltage GND and thereby turning it off. The register output (OUT) can thus be isolated from the low power supply voltage GND.

When the clock signal CLK is high, a data value can be latched in the master latch circuit 102 and be provided at the input of the slave latch circuit 104.

A high clock signal CLK can turn on n-type transistor M13 and turn off p-type transistor M15. The resulting low inverted clock signal /CLK can turn on p-type transistor M14 and turn off n-type transistor M16. In this way, the operation of the driver transistors M11 and M12 can depend upon the output of the master latch circuit 102.

If the output value from the master latch circuit 102 is low, n-type driver transistor M12 can be maintained off, while p-type driver transistor M11 can be turned on. The register output (OUT) can thus be driven high, and this value can be latched by inverters INV12 and INV13.

If the output value from the master latch circuit 102 is high, n-type driver transistor M12 can be turned on, while p-type driver transistor M11 can be maintained off. The register output (OUT) can be driven low, and this value can be latched by inverters INV12 and INV13.

In the event the flip-flop formed by inverters INV12 and INV13 has previously stored a different value, a driver transistor (M11 or M12) will have to overcome such a previously stored value. High speed latching of values can be improved by making the devices within inverters INV12 and INV13 relatively small with respect to transistors M11 and M12.

Within the slave latch circuit 104, with the clock signal CLK low, n-type transistor M13 can be turned off, isolating the input of the slave latch circuit 104 from the gate of p-type driver transistor M11. P-type transistor M15 can be turned on, placing the gate of p-type driver transistor M11 at the high power supply voltage VCC. In this way, p-type driver transistor M11 is turned off, isolating the register output (OUT) from the high power supply voltage VCC. In addition, the low clock signal CLK can be inverted by inverter INV11 to generate a high inverted clock signal /CLK. With a high inverted clock signal /CLK, p-type transistor M14 can be turned off, isolating the input of the slave latch circuit 104 from the gate of n-type driver transistor M12. N-type transistor M16 can be turned on, placing the gate of n-type driver transistor M12 at the low power supply voltage GND, and thereby turning it off. The register output (OUT) can thus be isolated from the low power supply voltage GND.

When the clock signal CLK returns low once again, the storing portion (inverters INV12 and INV13) of the register circuit 100 can be isolated from the output of master latch 102. In particular, n-type transistor M13 and p-type transistor M14 can be turned off, along with driver transistors M11 and M12. More particularly, the low clock signal CLK turns on p-type transistor M15, which in turn, turns off p-type driver transistor M11. Similarly, the high inverted clock signal /CLK turns on n-type transistor M16, which in turn, turns off n-type driver IGFET M12.

In this way, a value that is present at the output of the master latch circuit 102 when the clock signal CLK is high can be latched within the slave latch circuit 104 when the clock signal CLK subsequently transitions low.

In a register circuit, data is typically latched on the edge of a clock signal. In the above first embodiment 100 and conventional example 700, data can be latched on a low-to-high transition in the clock signal CLK. The time between this transition and the availability of data at the register output (OUT) is typically considered the delay of the register circuit. In order to achieve as fast a semiconductor device as possible, it is desirable to make this delay as small as possible.

In the conventional example 700, when the clocks signal CLK transition high, both transistors M71 and M72 are turned on. Consequently, two transistors in inverter INV72 (assuming a complementary MOS structure) can be driven according to the master latch 102 output. It is noted that in the event the output of the master latch 702 is a high value, the majority of the driving can be performed through the p-type transistor M71. Conversely, in the event the output of the master latch 702 is a low value, the majority of the driving can be performed through the n-type transistor M72.

In the first embodiment 100, when the clock signal CLK transitions high, one of the transistors M13 or M14 will be turned on, resulting in one of the driver transistors (M11 or M12) being turned on according to the master latch 102 output. Therefore, the first embodiment 100, by turning on only one transistor (M13 or M14), may provide some advantages over the conventional arrangement 700.

Having compared how master latch values can propagate into a slave latch, a comparison of switching operations between the first embodiment 100 and the conventional case 700 will be described.

In the conventional case (assuming CMOS inverters), when one transistor within inverter INV72 turns on, the other transistor must turn off. In such a switching period, complementary transistors may pull against one another. Consequently, the inverter INV72 can have a threshold value. Typically such a threshold value is set to VCC/2. Thus, in the conventional case 700, the output of master latch 702 may have to drive the input of inverter INV72 from one logic value past VCC/2 in order store an opposing logic value in the slave latch 704.

In contrast, in the first embodiment 100, p-type transistor M11 can be turned on when the output of the master latch 102 falls by a p-type threshold voltage Vtp below VCC.

Similarly, n-type transistor M12 can be turned on when the output of the master latch 102 rises by an n-type threshold voltage Vtn above the low power supply (GND). The Vtp and Vtn values can be less than VCC/2. Thus, the first embodiment 100 may provide faster switching of data values than the conventional example 700.

Referring again to FIG. 1, it is noted that while the inverters INV12 and INV13 may store a logic value that resists the direction of a driver transistor (M11 or M12), as noted above, devices within inverter INV12 and/or INV13 can be made small enough to make such effects essentially negligible.

Due to the above-described effects, it is believed that the speed of a register circuit according to the first embodiment 100 may be improved by 10–20% over conventional approaches.

Figure 7:
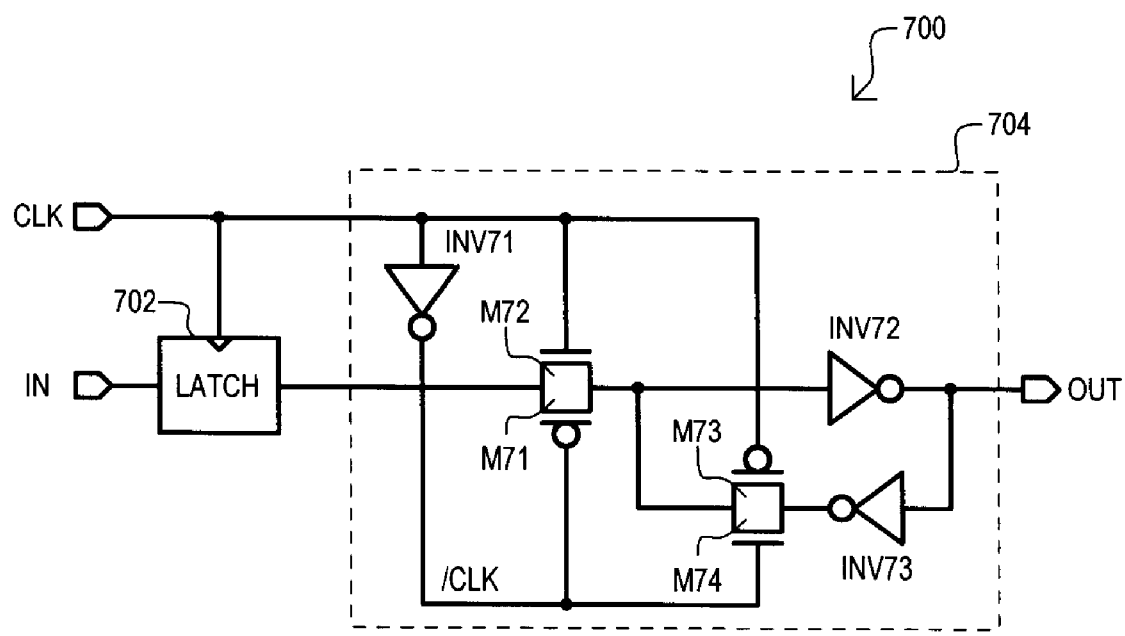
FIG. 7 is a circuit diagram of a conventional register circuit.

The present invention may provide additional benefits as well. The first embodiment 100 may consume less current than conventional approaches (such as that of FIG. 7). In particular, the first embodiment 100 can turn on a single driving device (M11 or M12). In contrast, in an inverter INV72 of the conventional example, both devices may be on for a certain period of time if a new value is being stored in the slave latch 704. As noted above, an integrated circuit may include multiple registers, thus according to the present invention current savings can be multiplied accordingly.

It is noted that the first embodiment 100 may present essentially the same clock signal load capacitance as the conventional case 700. In the conventional case 700, the clock signal CLK load can include the gates of transistors M72 and M73 and two transistors within inverter INV71. In the first embodiment 100 the clock signal CLK load can include the gates of transistors M13 and M15 and the gates of transistors within inverter INV11.

It is also noted that the first embodiment 100 does not significantly increase circuit area over the conventional approach 700. The first embodiment 100 can include two more transistors than the conventional case 700, but such transistors arise from inverter INV2 or INV3. As noted above, these transistors can be relatively small transistors.

Further, in the conventional case 700, to allow for high-speed operation size constraints are dominated by transistors M71, M72, M73 and M74 which can be larger than the other transistors. In the first embodiment 100, size constraints can also be dominated by four transistors, M11, M12, M13 and M14, which can be larger than the rest of the transistors in the register circuit 100. Thus, the addition of two small inverter transistors (from INV13 or INV14) can contribute very little to the overall size of the register circuit 100.

Figure 2:
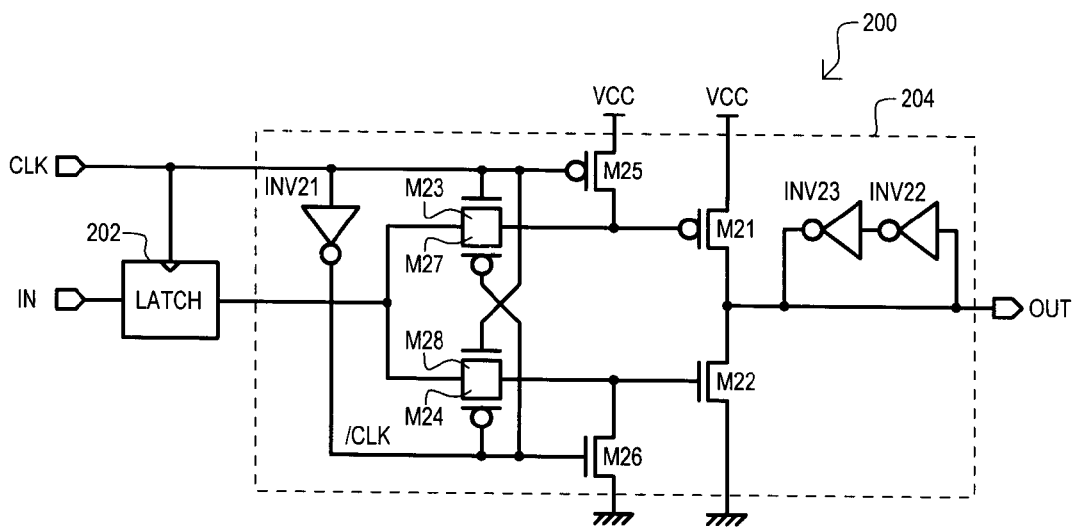
FIG. 2 is a circuit diagram of a register circuit according to a second embodiment.

Referring now to FIG. 2, a second embodiment is set forth in a circuit diagram. The second embodiment is designated by the general reference character 200, and may include many of the same circuit constituents as FIG. 1. To that extent, like constituents will be referred to by the same reference character but with the first digit being a "2" instead of a "1".

The second embodiment 200 can differ from the first embodiment 100 in that it may include a p-type transistor M27 having a source-drain path arranged in parallel with that of n-type transistor M23. The second embodiment 200 may further include an n-type transistor M28 having a source-drain path arranged in parallel with that of p-type transistor M24. The gate of n-type transistor M28 can receive the clock signal CLK, the gate of p-type transistor M27 can receive the inverted clock signal /CLK.

Transistors M27 and M28 can help to ensure that one driver transistor (M21 or M22) is turned off while the other (M22 or M21) is turned on when the clock signal CLK transitions high.

In an arrangement such as that shown in FIG. 1, that does not include transistors like M27 and M28, there may a brief moment where transistor M14 and M16 are turned off and the gate of transistor M12 is left floating. Provided the potential at the floating node remains lower than the Vtn of transistor M12, essentially no adverse consequences can result.

However, because transistor M14 is a p-type transistor, if the output of the master latch circuit 102 is low, the gate of transistor M12 may not be discharged completely. Consequently, transistor M12 may have some current leakage.

If the possibility of current leakage noted above is not acceptable to a device specification, a structure such as that shown in FIG. 2 can be utilized. In FIG. 2, transistor M28 can essentially ensure that the gate of transistor M22 is completely discharged.

Transistor M27 can function in a similar fashion with respect to transistor M21. During a transition in the clock signal CLK, transistors M23 and M25 may be turned off, leaving the gate node of transistor M21 floating. In the event the output of the master latch circuit 202 is high, there may be insufficient charging at the gate of transistor M21, and there may be some leakage by transistor M21.

The embodiment of FIG. 2 can address such a problem by providing transistor M27. Because transistor M27 is a p-type transistor, it can ensure that the gate of driving transistor M21 can be sufficiently charged, and thus maintained off.

In the arrangement such as FIG. 2, transistors M27 and M28 can serve to establish particular potentials at the gates of driver transistors M21 and M22. Consequently, the size of transistors M27 and M28 can be small with respect to the other transistors in the register circuit 200. Thus, the inclusion of transistors M27 and M28 contribute relatively little to the /CLK and CLK signal input capacitance.

Figure 3:
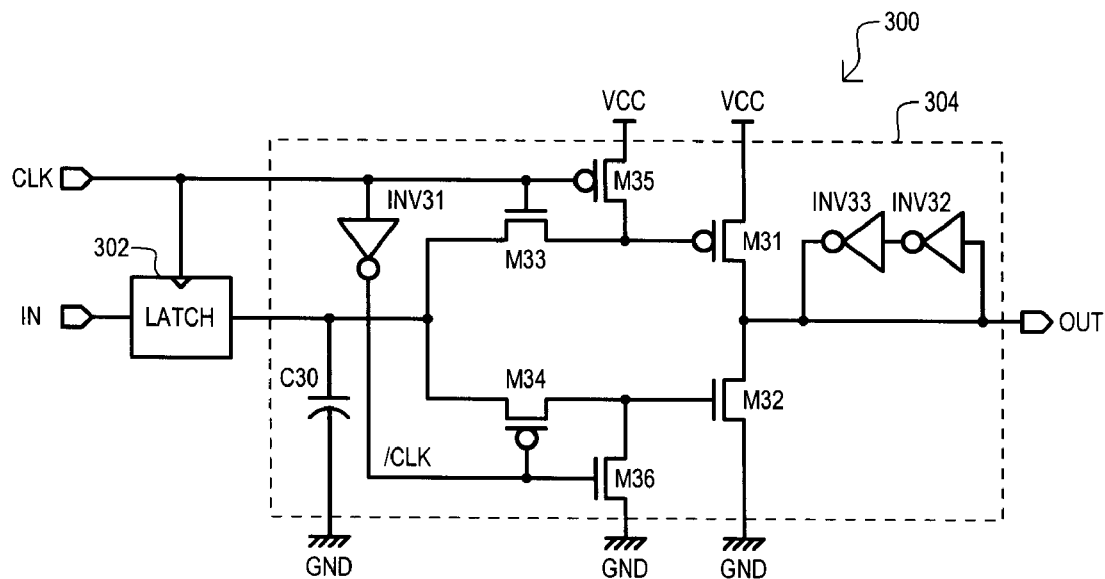
FIG. 3 is a circuit diagram of a register circuit according to a third embodiment.

Referring now to FIG. 3, a third embodiment is set forth in a circuit diagram. The third embodiment is designated by the general reference character 300, and may include many of the same circuit constituents as FIG. 1. To that extent, like constituents will be referred to by the same reference character but with the first digit being a "3" instead of a "1."

The third embodiment 300 can differ from the first embodiment 100 in that it may include a capacitor C30 connected between the input of the slave latch circuit 304 and a low power supply voltage (GND).

If reference is made to FIG. 3, in order for driver transistor M31 to turn on, transistor M33 must turn on. Similarly, in order for drive transistor M32 to turn on, transistor M34 must first turn on. Thus, the speed at which a value can be driven at the register output (OUT) can depend upon how fast transistors M33 and M34 can turn on. However, in arrangements such as those shown in FIGS. 1 and 2, such transistors may have a slower response than desired.

Referring back to FIG. 1, when transistor M13 turns on, the discharging current can result in the source potential of transistor M13 rising. Such a rise in source potential decreases the gate-to-source potential, thereby slowing down the speed at which transistor M13 turns on. Similarly, when transistor M14 turns on, the charging current can result in the source of transistor M14 falling. This same response may also occur in the second embodiment 200 with transistors M23 and M24.

In contrast to the first and second embodiments (100 and 200), the third embodiment 300 includes the capacitor C30.

Thus, when transistor M33 turns on, capacitor C30 can "sink" a larger amount of charge, allowing for a faster response for M33 than the previous embodiments. Similarly, when transistor M34 turns on, capacitor C30 can supply a larger amount of charge, allowing for a faster response for M34 than the previous embodiments.

In this way, the speed of the third embodiment 300 can be further improved.

Figure 4:
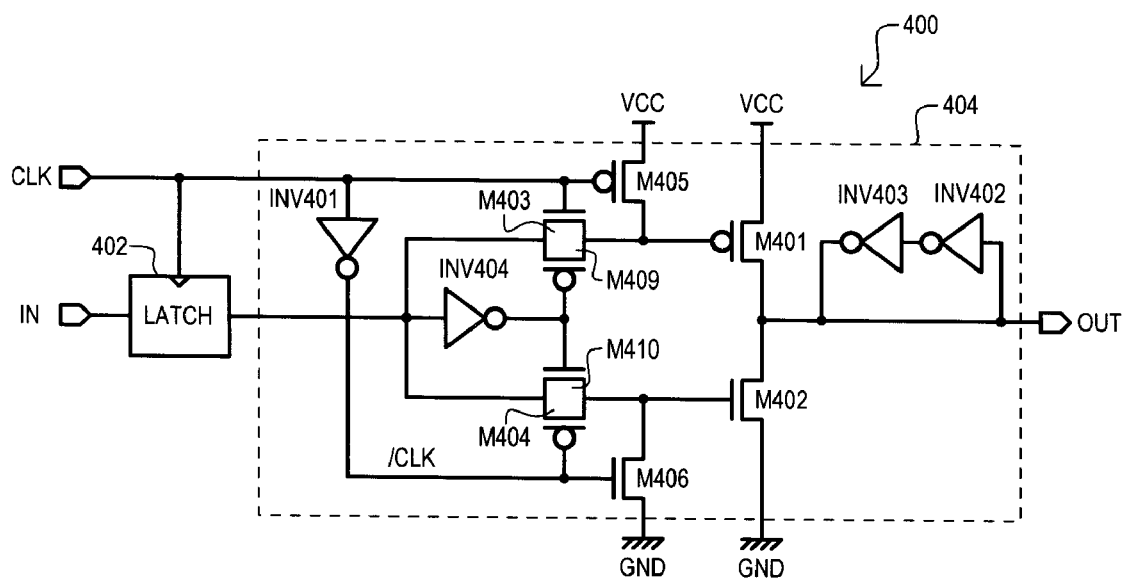
FIG. 4 is a circuit diagram of a register circuit according to a fourth embodiment.

Referring now to FIG. 4, a fourth embodiment is set forth in a circuit diagram. The fourth embodiment is designated by the general reference character 400, and may include many of the same circuit constituents as FIG. 1. To that extent, like constituents will be referred to by the same reference character but with the first digit being a "4" instead of a "1."

The fourth embodiment 400 can differ from the first embodiment 100 in that it may include a p-type transistor M409 having a source-drain path arranged in parallel with that of n-type transistor M403. The fourth embodiment 400 may further include an n-type transistor M410 having a source-drain path arranged in parallel with that of p-type transistor M404. The fourth embodiment 400 can further include an inverter INV404. The inverter INV404 can invert the output of a master latch 402, and supply the inverted value to the gates of transistors M409 and M410.

It will be recalled that the second embodiment 200 included transistors M27 and M28 to help ensure that one driver transistor was turned off while the other was turned on. The fourth embodiment 400 can provide a similar effect by operation of transistors M409 and M410 and inverter INV404.

Referring back to FIG. 4, when the output of the master latch circuit 400 is low and the clock signal CLK transitions high, in a similar fashion to the first embodiment 100, transistor M403 can be turned on, resulting the low master latch circuit 400 output turning on driver transistor M401. At the same general time, the low output of the master latch circuit 402 is inverted by inverter INV404, turning on transistor M410. This can connect the full low master latch circuit 400 output to the gate of n-type driver transistor M402 and ensure that transistor M402 remains turned off.

Conversely, when the output of the master latch circuit 400 is high and the clock signal CLK transitions high, transistor M404 can be turned on, resulting the high master latch circuit 400 output turning on driver transistor M402. At the same general time, the high output of the master latch circuit 402 is inverted by inverter INV404, turning on transistor M409. This can connect the full high master latch circuit 400 output to the gate of p-type driver transistor M401 and ensure that transistor M401 remains turned off.

It is noted that the second embodiment 200 could result in some increase in the clock signal CLK load capacitance. More particularly, transistor M28 could contribute gate capacitance to the load of clock signal CLK, while transistor M27 could contribute gate capacitance to the load of inverted clock signal /CLK. In contrast, the arrangement of FIG. 4 may not increase clock signal capacitance, as the discharge/charge transistors M409 and M410 are driven by inverter INV404, and not a clock signal.

The fourth embodiment 400 can increase transistor count by the inclusion of inverter INV404.

Figure 5:
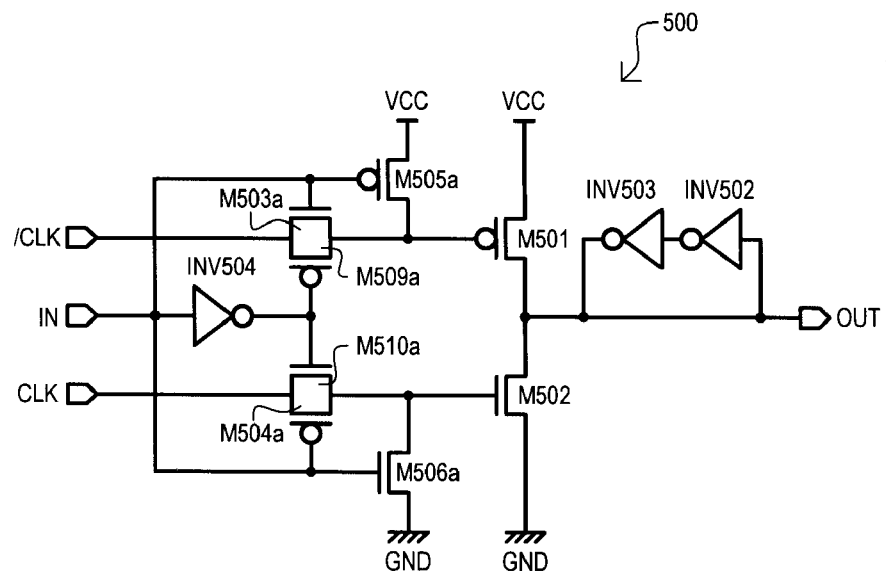
FIG. 5 is a circuit diagram of a latch circuit according to a fifth embodiment.

Referring now to FIG. 5, a fifth embodiment is set forth in a circuit diagram. The fifth embodiment is designated by the general reference character 500, and may include some of the same circuit constituents as FIG. 1. To that extent, like constituents will be referred to by the same reference character but with the first digit being a "5" instead of a "1."

The fifth embodiment 500 shows a circuit diagram of a latch circuit. The latch circuit 500 may include a p-type driver transistor M501 and an n-type driver transistor M502 that can establish a logic value at a latch circuit 500 output OUT. Like the previous embodiments, the gate of p-type driver transistor M501 can be connected to a high power supply voltage VCC by a p-type transistor M505a and the gate of n-type driver transistor M502 can be connected to a low power supply voltage GND by an n-type transistor M506a. Further, series connected inverters INV502 and INV503 can form a flip-flop for storing a received data value.

Unlike the previously described examples, driver transistors (M501 and M502) can be activated by a clock signal, as opposed to the output of a master latch circuit. In the particular arrangement of FIG. 5, p-type driver transistor M501 can be turned on and off by an inverted clock signal /CLK, while n-type driver transistor M502 can be turned on and off by clock signal CLK.

The clock signal CLK and inverted clock signal /CLK can be supplied to their respective driver transistors (M501 and M502) according to an input signal IN. In the particular arrangement of FIG. 5, the source-drain paths of an n-type transistor M503a and a p-type transistor M509a are connected in parallel between the gate of driver transistor M501 and an inverted clock signal /CLK. Similarly, the source-drain paths of an n-type transistor M510a and a p-type transistor M504a are connected in parallel between the gate of driver transistor M502 and a clock signal CLK.

The gates of transistors M503a and M504a are commonly connected to an input signal IN. The input signal IN can be inverted by inverter INV504 with the resulting output being commonly applied to the gates of transistors M509a and M510a.

As shown in FIG. 5, the operation of transistors M505a and M506a can be determined by the input signal IN.

In the fifth embodiment 500, an input data value IN may pass through, and be stored in the circuit 500 when the clock signal CLK transitions high (and the inverted clock signal /CLK transitions low). The data value may then be latched in the latch circuit 500 when the clock signal CLK subsequently transitions low (and the inverted clock signal /CLK transitions high).

In the event the clock signal CLK transitions high (and /CLK transitions low) and the input signal IN is low, n-type transistor M503a will be turned off while p-type transistor M504a will be turned on. Further, p-type transistor M505a will be turned on, while n-type transistor M506a will be turned off. The output of inverter INV504 is high, thus p-type transistor M509a will be turned off, while n-type transistor M510a will be turned on. Consequently, the high clock signal CLK will propagate to the gate of driver transistor M502. Driver transistor M502 will be turned on, and the output OUT will be driven low. Because transistor M505a is turned on, driver transistor M501 will remain turned off.

In the event the clock signal CLK transitions high (and /CLK transitions low) and the input signal IN is high, p-type transistor M504a will be turned off while n-type transistor M503a will be turned on. Further, p-type transistor M505a will be turned off, while n-type transistor M506a will be turned on. The output of inverter INV504 is low, thus p-type transistor M509a will be turned on, while n-type transistor M510a will be turned off. Consequently, the low inverted clock signal /CLK will propagate to the gate of driver transistor M501. Driver transistor M501 will be turned on, and the output OUT will be driven high. Because transistor M506a is turned on, driver transistor M502 will remain turned off.

In the event the clock signal CLK transitions low (and /CLK transitions high) and the input signal IN is low, transistors M503a and M506a are turned off. The output of inverter INV504 results in transistor M509a being turned off. Transistor M505a and M504a are turned on. Inverter INV504a also results in transistor M510a being turned on. With transistor M505a turned on, the gate of driver transistor M501 is driven to the high power supply level VCC. With transistors M510a and M504a turned on, the low clock signal CLK can be applied to the gate of driver transistor M502. Thus, driver transistors M501 and M502 are both turned off.

In this way, when the clock signal CLK transitions low and the input signal IN is low, the output of the latch circuit 500 can be placed in a high impedance state, while holding a low output value in the flip-flop circuit of INV502 and INV503.

In the event the clock signal CLK transitions low (and /CLK transitions high) and the input signal IN is high, transistors M504a and M505a are turned off. The output of inverter INV504 results in transistor M510a being turned off. Transistor M503a and M506a are turned on. Inverter INV504 also results in transistor M509a being turned on. With transistor M506a turned on, the gate of n-type driver transistor M502 is driven to the low power supply level GND. With transistors M503a and M509a turned on, the high inverted clock signal /CLK can be applied to the gate of p-type driver transistor M501. Thus, driver transistors M501 and M502 are both turned off. In this way, the output of the latch circuit 500 can be placed in a high impedance state, while holding the high output value in the flip-flip circuit of INV502 and INV503.

The speed of the fifth embodiment 500 can be determined according to the time between a high transition in the clock signal CLK and when data is available at the output (OUT). In the above described conventional case and previous embodiments, a clock signal activates a transfer gate. That is, the clock signal CLK (and its inverse) is applied to the gates of transistors in a transfer path between driver transistors and a master latch circuit output. The arrangement of fifth embodiment 500 includes a clock signal CLK (and its inverse) that are applied directly to the sources of transfer gates (M503a/M509a and M504a/M510a). This can lead to faster operating speeds than the previously described approaches.

It is noted that in the embodiments of FIGS. 1–4, driver transistors logically invert received input data. In contrast, the latch circuit of FIG. 5 can function as a buffer, providing an output value (OUT) that has the same logic value as a received input value (IN).

It is also noted that in the embodiment of FIG. 5, it can be possible to switch wiring between the input signal IN and the clock signal CLK. In particular, the input that receives the /CLK signal can receive an inverted input signal /IN, the input that receives the input signal IN can receive the clock signal CLK, and the input that receives the clock signal CLK can receive the input signal IN. Such an arrangement can improve the speed between a change in an input value IN and the resulting change in an output value (OUT).

Figure 6:
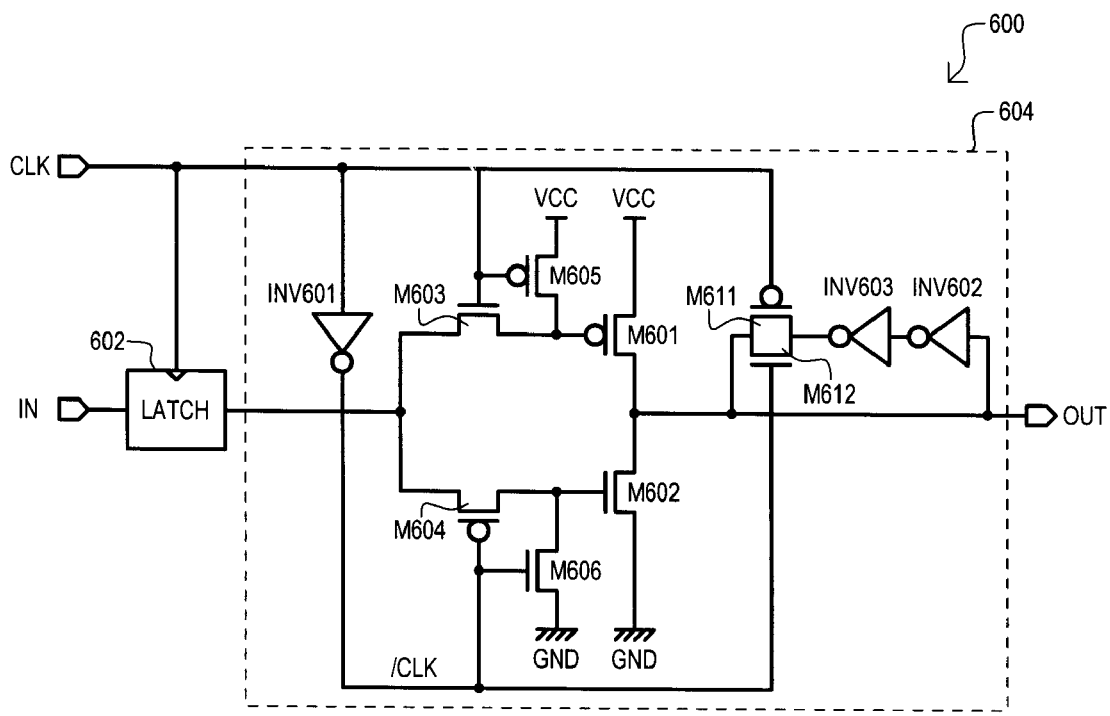
FIG. 6 is a circuit diagram of a register circuit according to a sixth embodiment.

Referring now to FIG. 6, a sixth embodiment is set forth in a circuit diagram. The sixth embodiment is designated by the general reference character 600, and may include many of the same circuit constituents as FIG. 1. To that extent, like constituents will be referred to by the same reference character but with the first digit being a "6" instead of a "1."

The sixth embodiment 600 can differ from the first embodiment 100 in that it may include a transfer gate in the data storing flip-flop section (INV602 and INV603). In one particular arrangement, a transfer gate can be formed from a p-type transistor M611 and an n-type transistor M612 having source-drain paths arranged in parallel between the output of inverter INV603 and the register circuit 600 output (OUT). The gate of p-type transistor M611 can receive the clock signal while the gate of n-type transistor M612 can receive the inverted clock signal /CLK.

A transfer gate such as M611/M612 can reduce the current consumed by the storing circuits (INV602 and INV603) when the logic value at the output is changed.

In the particular arrangement of FIG. 6, when the clock signal CLK transitions high, the slave latch circuit 602 can enter a "through" state (i.e., data from the output of master latch circuit 601 can be stored in the slave latch circuit 602). In such a through state, the transfer gate M611/M612 is turned off. Consequently, logic values can occur at the output (OUT) of the register without having to overcome the previous logic state held by inverters INV602 and INV603 (which can consume current). In this way, the sixth embodiment 600 can provide a register circuit of high speed and less current consumption. It is noted that the sixth embodiment 600 can also result in a slight increase to the clock signal CLK load and inverted clock /CLK signal load.

Various embodiments have been described that may provide advantages over conventional register and latch circuits when implemented. According to the present invention, a register circuit may include a first p-channel transistor a first n-channel transistor for driving an output node. A second n-channel transistor can have a first transfer gate path connected to the gate of the first p-channel transistor. A second p-channel transistor can have a second transfer gate path connected to the gate of the first n-channel transistor. The first p-channel transistor and second n-channel transistor can be driven by way of the first and second transfer gate paths, respectively. In this way, the speed of the register circuit can be improved, as it is not necessary to overcome a data storage circuit with a received input signal.

Further, the above arrangement can reduce current consumption. In operation, only the gate of the first p-channel transistor or first n-channel transistor (which can be large devices) can be driven. Further, such an arrangement does not turn on both the first p-channel transistor and first n-channel transistor simultaneously.

Further current savings can be achieved by also including a transfer gate in a flip-flop section. The transfer gate can be positioned between the output of the flip-flop and the output of the register circuit. Thus, when a stored data value changes, the output of the flip-flop can be isolated from the output of the register circuit. Consequently, a data change value does not have to "overcome" the flip-flop circuit devices to establish a new logic value. In one arrangement, the transfer gate can include a p-channel transistor and n-channel transistor arranged in parallel.

The present invention can include embodiments that allow for the rapid turning off of driver transistors, such as the first p-channel transistor and/or first n-channel transistor. A third p-channel transistor can be connected to the gate of the first p-channel transistor for turning the first p-channel transistor off. The gate of the third p-channel transistor can be driven by a clock signal to thereby disable the first p-channel transistor. The gate of the third p-channel transistor may also be driven according to a master latch output value. This can serve to reduce the clock signal load, and thereby increase operating speed.

In a similar arrangement to the above, a third n-channel transistor can be connected to the gate of the first n-channel transistor for turning the first n-channel transistor off. The gate of the third n-channel transistor can be driven by a clock signal to thereby disable the first n-channel transistor. The gate of the third n-channel transistor may also be driven according to a master latch output value. This can serve to also reduce the clock signal load and thereby increase operating speed.

The present invention can also advantageously increase operating speeds by including a capacitor at the input of the slave latch circuit. Such a capacitor can suppress undesirable transient rises in current due to the charging and discharging involved in activating driver transistors. Such an arrangement can result in the faster activation of driver transistors, and hence a faster register circuit.

The present invention also teaches a latch circuit that may have faster response. A latch circuit of the present invention may include first and second driver transistors that drive a latch output node. A control terminal of the first driver transistor may be driven by way of a first transfer gate. A control terminal of the second driver transistor may be driven by way of a second transfer gate. In one arrangement, the first and second transfer gates can be enabled according to an input signal to thereby apply complementary clock signals to the first and second driver transistors. The first and second transfer gates may include complementary transistors arranged in parallel.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A register circuit, comprising:
   a master latch;
   a slave latch that includes
      a first driver transistor disposed between a first supply node and a register output terminal;
      a second driver transistor disposed between a second supply node and the register output terminal;
      a first controllable impedance path disposed between a control terminal of the first driver transistor and an output of the master latch, the first controllable impedance having a low impedance in response to a first clock value;
      a second controllable impedance path disposed between a control terminal of the second driver transistor and the output of the master latch, the second controllable impedance having a low impedance in response to the first clock value; and
      a disable circuit that disables the first and second driver transistors when the slave latch circuit latches data from the master latch.

2. The register circuit of claim 1, wherein:
   the disable circuit includes
      a first disable transistor between the first supply node and the control terminal of the first driver transistor, the first disable transistor being activated in response to a second clock value; and
      a second disable transistor between the second supply node and the control terminal of the second driver transistor, the second disable transistor being activated in response to the second clock value.

3. A register circuit, comprising:
a master latch;
a slave latch that includes
   a first driver transistor of a first conductivity type disposed between a first supply node and a register output terminal;
   a second driver transistor disposed between a second supply node and the register output terminal;
   a first controllable impedance path disposed between a control terminal of the first driver transistor and an output of the master latch, the first controllable impedance having a low impedance in response to a first clock value;
   a second controllable impedance path disposed between a control terminal of the second driver transistor and the output of the master latch, the second controllable impedance having a low impedance in response to the first clock value; and
   a first disable path coupled to the control terminal of the first driver transistor, the disable path placing the first driver transistor control terminal at a disabling potential when the second driver transistor is enabled, the first disable path including a disable transistor of the first conductivity type having a control terminal coupled to a clock signal.

4. A register circuit, comprising:
a master latch;
a slave latch that includes
   a first driver transistor of a first conductivity type disposed between a first supply node and a register output terminal;
   a second driver transistor disposed between a second supply node and the register output terminal;
   a first controllable impedance path disposed between a control terminal of the first driver transistor and an output of the master latch, the first controllable impedance having a low impedance in response to a first clock value;
   a second controllable impedance path disposed between a control terminal of the second driver transistor and the output of the master latch, the second controllable impedance having a low impedance in response to the first clock value; and
   a first disable path coupled to the control terminal of the first driver transistor, the disable path placing the first driver transistor control terminal at a disabling potential when the second driver transistor is enabled, the first disable path including a disable transistor having a control terminal coupled to a master latch output value.

5. A register circuit, comprising:
a master latch;
a slave latch that includes
   a first driver transistor of a first conductivity type disposed between a first supply node and a register output terminal;
   a second driver transistor disposed between a second supply node and the register output terminal;
   a first controllable impedance path disposed between a control terminal of the first driver transistor and an output of the master latch, the first controllable impedance having a low impedance in response to a first clock value;
   a second controllable impedance path disposed between a control terminal of the second driver transistor and the output of the master latch, the second controllable impedance having a low impedance in response to the first clock value; and
   a first disable path coupled to the control terminal of the first driver transistor, the disable path placing the first driver transistor control terminal at a disabling potential when the second driver transistor is enabled; and
   a second disable path coupled to the control terminal of the second driver transistor, the second disable path placing the second driver transistor control terminal at a disabling potential when the first driver transistor is enabled; wherein
      the second driver transistor is of a second conductivity type; and
      the second disable path includes a disable transistor of the second conductivity type having a control terminal coupled to a clock signal.

6. A register circuit, comprising:
a master latch;
a slave latch that includes
   a first driver transistor of a first conductivity type disposed between a first supply node and a register output terminal;
   a second driver transistor disposed between a second supply node and the register output terminal;
   a first controllable impedance path disposed between a control terminal of the first driver transistor and an output of the master latch, the first controllable impedance having a low impedance in response to a first clock value;
   a second controllable impedance path disposed between a control terminal of the second driver transistor and the output of the master latch, the second controllable impedance having a low impedance in response to the first clock value; and
   a first disable path coupled to the control terminal of the first driver transistor, the disable path placing the first driver transistor control terminal at a disabling potential when the second driver transistor is enabled; and
   a second disable path coupled to the control terminal of the second driver transistor, the second disable path placing the second driver transistor control terminal at a disabling potential when the first driver transistor is enabled; wherein
      the second disable path includes a disable transistor having a control terminal coupled to a master latch output value.

7. A register circuit, comprising:
a master latch;
a slave latch that includes
   a first driver transistor of a first conductivity type disposed between a first supply node and a register output terminal;
   a second driver transistor disposed between a second supply node and the register output terminal;
   a first controllable impedance path disposed between a control terminal of the first driver transistor and an output of the master latch, the first controllable impedance having a low impedance in response to a first clock value;
   a second controllable impedance path disposed between a control terminal of the second driver transistor and the output of the master latch, the second controllable impedance having a low impedance in response to the first clock value; and a capacitor coupled between an input terminal of the slave latch circuit and a predetermined potential.

8. A circuit, comprising:

a first driver transistor disposed between a first supply node and a register output terminal;

a second driver transistor disposed between a second supply node and the register output terminal;

a first transfer circuit coupled between a first clock signal terminal and a control terminal of the first driver transistor;

a second transfer circuit coupled between a second clock signal terminal and a control terminal of the second driver transistor;

a first disable device coupled between the control terminal of the first driver transistor and the first supply node;

a second disable device coupled between the control terminal of the second driver transistor and the second supply node; and an input signal coupled to the first transfer circuit;

wherein the first transfer circuit and the second disable device provide low impedance paths when the input signal has a first value and the second transfer circuit and the first disable device provide low impedance paths when the input signal has a second value.

9. The circuit of claim 8, further including:

a flip-flop circuit for storing data in the circuit, the flip-flop circuit including transistors that have an area less than that of the first or second driver transistor.

10. A register circuit, comprising:

a first transistor of a first conductivity type coupled between a first potential and an output node;

a first transistor of a second conductivity type coupled between the output node and a second potential that is less than the first potential;

a second transistor of the second conductivity type coupled between the gate of the first transistor of the first conductivity type and a first node, and having a gate coupled to a second node wherein the gate of the first transistor of the first conductivity type is not directly connected to the gate of the first transistor of the second conductivity type;

a second transistor of the first conductivity type coupled to the gate of the first transistor of the second conductivity type;

a third transistor of the first conductivity type coupled between the gate of the first transistor of the first conductivity type and the first potential, and having a gate coupled to the second node;

a third transistor of the second conductivity type coupled between the gate of the first transistor of the second conductivity type and the second potential; and a flip-flop circuit coupled to the output node; wherein the first and second nodes receive different signals.

11. The register circuit of claim 10, wherein:

the first node receives the output value from a master latch; and the second node receives a periodic clock signal.

12. The register circuit of claim 10, wherein:

the first node receives a periodic clock signal; and the second node receives an input value.

* * * * *